(12) United States Patent
Lee et al.

(10) Patent No.: US 11,749,748 B2
(45) Date of Patent: Sep. 5, 2023

(54) HIGH ELECTRON MOBILITY TRANSISTOR AND METHOD FOR FABRICATING THE SAME

(71) Applicant: UNITED MICROELECTRONICS CORP., Hsin-Chu (TW)

(72) Inventors: Kai-Lin Lee, Kinmen County (TW); Zhi-Cheng Lee, Tainan (TW); Wei-Jen Chen, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 11 days.

(21) Appl. No.: 17/367,647

(22) Filed: Jul. 6, 2021

(65) Prior Publication Data

US 2021/0336044 A1 Oct. 28, 2021

Related U.S. Application Data

(62) Division of application No. 16/691,621, filed on Nov. 22, 2019, now Pat. No. 11,088,271.

(30) Foreign Application Priority Data

Oct. 30, 2019 (CN) .......................... 201911044101.8

(51) Int. Cl.
*H01L 29/778* (2006.01)
*H01L 21/02* (2006.01)
*H01L 29/20* (2006.01)
*H01L 21/308* (2006.01)
*H01L 29/66* (2006.01)

(52) U.S. Cl.
CPC ...... *H01L 29/7786* (2013.01); *H01L 21/0254* (2013.01); *H01L 21/02639* (2013.01); *H01L 21/308* (2013.01); *H01L 29/2003* (2013.01); *H01L 29/66462* (2013.01)

(58) Field of Classification Search
None
See application file for complete search history.

(56) References Cited

U.S. PATENT DOCUMENTS

| | | | |
|---|---|---|---|
| 7,812,369 B2 | 10/2010 | Chini et al. | |
| 9,041,064 B2 | 5/2015 | Wu et al. | |
| 9,379,191 B2 | 6/2016 | Hsu et al. | |
| 2016/0233311 A1* | 8/2016 | Masumoto | ........ H01L 29/66462 |
| 2016/0240645 A1 | 8/2016 | Prechtl | |
| 2020/0373408 A1 | 11/2020 | Hsu | |

* cited by examiner

*Primary Examiner* — Asok K Sarkar
(74) *Attorney, Agent, or Firm* — Winston Hsu

(57) ABSTRACT

A method for fabricating high electron mobility transistor (HEMT) includes the steps of: forming a buffer layer on a substrate; forming a barrier layer on the buffer layer; forming a hard mask on the barrier layer; removing the hard mask to form a first recess for exposing the barrier layer; removing the hard mask adjacent to the first recess to form a second recess; and forming a p-type semiconductor layer in the first recess and the second recess.

10 Claims, 2 Drawing Sheets

HIGH ELECTRON MOBILITY TRANSISTOR AND METHOD FOR FABRICATING THE SAME

CROSS REFERENCE TO RELATED APPLICATIONS

This application is a division of U.S. application Ser. No. 16/691,621 filed Nov. 22, 2019, and incorporated herein by reference in its entirety.

BACKGROUND OF THE INVENTION

1. Field of the Invention

The invention relates to a high electron mobility transistor (HEMT) and method for fabricating the same.

2. Description of the Prior Art

High electron mobility transistor (HEMT) fabricated from GaN-based materials have various advantages in electrical, mechanical, and chemical aspects of the field. For instance, advantages including wide band gap, high break down voltage, high electron mobility, high elastic modulus, high piezoelectric and piezoresistive coefficients, and chemical inertness. All of these advantages allow GaN-based materials to be used in numerous applications including high intensity light emitting diodes (LEDs), power switching devices, regulators, battery protectors, display panel drivers, and communication devices.

SUMMARY OF THE INVENTION

According to an embodiment of the present invention, a method for fabricating high electron mobility transistor (HEMT) includes the steps of: forming a buffer layer on a substrate; forming a barrier layer on the buffer layer; forming a hard mask on the barrier layer; removing the hard mask to form a first recess for exposing the barrier layer; removing the hard mask adjacent to the first recess to form a second recess; and forming a p-type semiconductor layer in the first recess and the second recess.

According to another aspect of the present invention, a high electron mobility transistor (HEMT) includes: a buffer layer on a substrate; a barrier layer on the buffer layer; a p-type semiconductor layer on the barrier layer; a gate electrode on the p-type semiconductor layer; and a source electrode and a drain electrode adjacent to two sides of the gate electrode on the buffer layer. Preferably, the p-type semiconductor layer comprises a L-shape.

According to yet another aspect of the present invention, a high electron mobility transistor (HEMT) includes: a buffer layer on a substrate; a barrier layer on the buffer layer; a p-type semiconductor layer on the barrier layer; a gate electrode on the p-type semiconductor layer; and a source electrode and a drain electrode adjacent to two sides of the gate electrode on the buffer layer. Preferably, the p-type semiconductor layer comprises a T-shape These and other objectives of the present invention will no doubt become obvious to those of ordinary skill in the art after reading the following detailed description of the preferred embodiment that is illustrated in the various figures and drawings.

DETAILED DESCRIPTION

Referring to the FIGS. 1-5, FIGS. 1-5 illustrate a method for fabricating a HEMT according to an embodiment of the present invention. As shown in the FIG. 1, a substrate 12 such as a substrate made from silicon, silicon carbide, or aluminum oxide (or also referred to as sapphire) is provided, in which the substrate 12 could be a single-layered substrate, a multi-layered substrate, gradient substrate, or combination thereof. According to other embodiment of the present invention, the substrate 12 could also include a silicon-on-insulator (SOI) substrate.

Next, a buffer layer 14 is formed on the substrate 12. According to an embodiment of the present invention, the buffer layer 14 is preferably made of III-V semiconductors such as gallium nitride (GaN), in which a thickness of the buffer layer 14 could be between 0.5 microns to 10 microns. According to an embodiment of the present invention, the formation of the buffer layer 14 could be accomplished by a molecular-beam epitaxy (MBE) process, a metal organic chemical vapor deposition (MOCVD) process, a chemical vapor deposition (CVD) process, a hydride vapor phase epitaxy (HVPE) process, or combination thereof.

Next, a barrier layer 16 is formed on the surface of the buffer layer 14. In this embodiment, the barrier layer 16 is preferably made of III-V semiconductor such as aluminum gallium nitride ($Al_xGa_{1-x}N$), in which 0<x<1, x being less than or equal to 20%, and the barrier layer 16 preferably includes an epitaxial layer formed through epitaxial growth process. Similar to the buffer layer 14, the formation of the barrier layer 16 on the buffer layer 14 could be accomplished by a molecular-beam epitaxy (MBE) process, a metal organic chemical vapor deposition (MOCVD) process, a chemical vapor deposition (CVD) process, a hydride vapor phase epitaxy (HVPE) process, or combination thereof. It should be noted that even though the barrier layer 16 is formed directly on the surface of the buffer layer 14, according to another embodiment of the present invention, it would also be desirable to form an extra metal nitride layer (not shown) including but not limited to for example aluminum nitride (AlN) between the buffer layer 14 and the barrier layer 16, which is also within the scope of the present invention.

Next, a MESA isolation process is conducted to define a MESA area 18 and an active area so that devices could be isolated to operate independently without affecting each other. In this embodiment, the MESA isolation process could be accomplished by conducting a photo-etching process to remove part of the barrier layer 16 and part of the buffer layer 14, in which the patterned barrier layer 16 and the patterned buffer layer 14 preferably share equal widths and edges of the three layers are aligned. The width of the remaining un-patterned buffer layer 14 is preferably equal to the width of the substrate 12.

Figure 1:
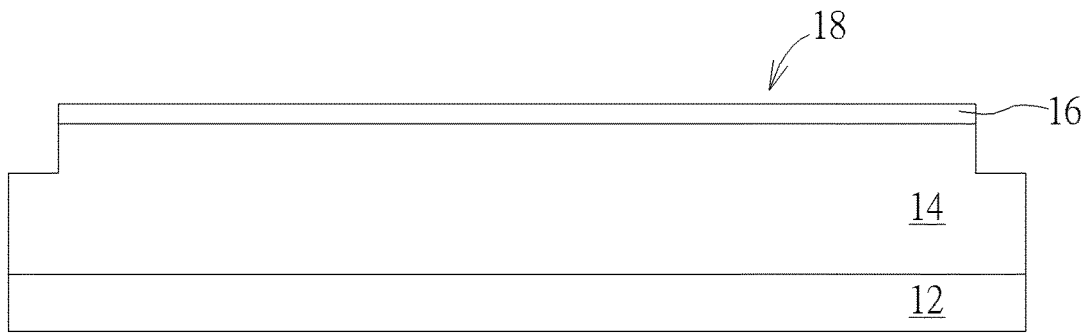
FIGS. 1-5 illustrate a method for fabricating a HEMT according to an embodiment of the present invention.
Figure 2:
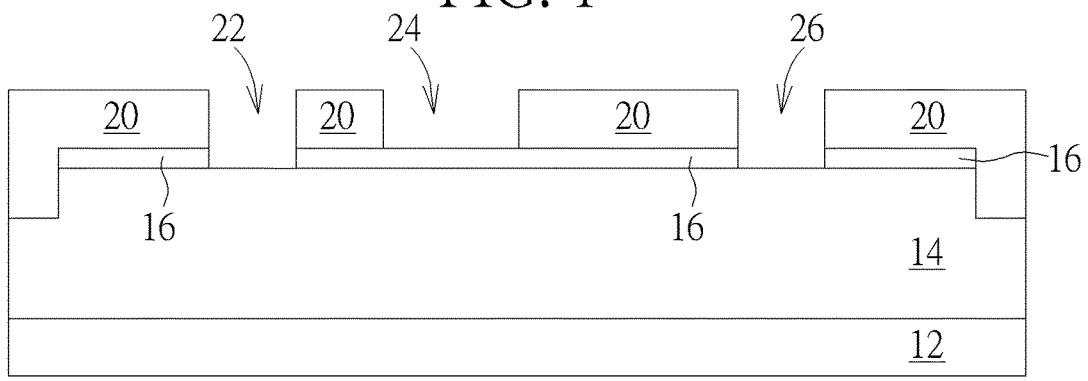

Next, as shown in FIG. 2, a hard mask 20 is formed on the surface of the barrier layer 16 and buffer layer 14, and one or more photo-etching process is conducted to remove part of the hard mask 20 and part of the barrier layer 16 to form a plurality of recesses 22, 24, 26, in which the recess 24 in the center exposes the barrier layer 16 while the two recesses 22, 26 on adjacent sides expose the buffer layer 14. Preferably, the recess 24 in the center is used for fabricating a gate electrode in the later process and the two recesses 22, 26 on adjacent sides are used for forming source electrode and drain electrode. It should be noted that in alternative to the aforementioned patterning process for forming the recesses 22, 24, 26, another embodiment of the present invention could be accomplished by first conducting a photo-etching process to remove part of the barrier layer 16 for forming recesses 22, 26, forming the hard mask 20 on the barrier layer 16, and then conducting another photo-etching process to remove part of the hard mask 20 for forming recesses 22, 24, 26 at the same time, which is also within the scope of the present invention. In this embodiment, the hard mask 20 preferably includes silicon nitride and the thickness thereof is approximately 5 nm, but not limited thereto.

Figure 3:
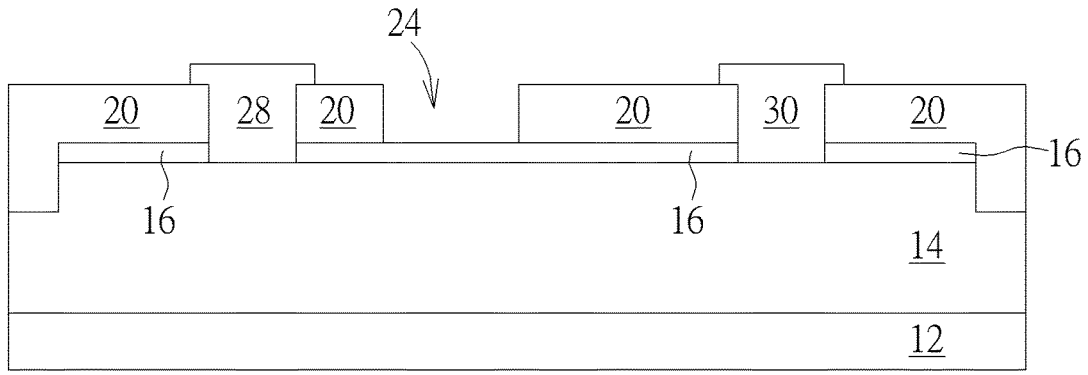

Next, as shown in FIG. 3, a source electrode 28 and a drain electrode 30 are formed in the two adjacent recesses 22, 26, in which the source electrode 28 and the drain electrode 30 are preferably made of ohmic contact metals. According to an embodiment of the present invention, each of the source electrode 28 and drain electrode 30 could include titanium (Ti), aluminum (Al), tungsten (W), palladium (Pd), or combination thereof. Moreover, it would be desirable to first conduct a photo-etching process to remove part of the hard mask 20 and part of the barrier layer 16 for forming the recesses 22, 26, conduct an electroplating process, sputtering process, resistance heating evaporation process, electron beam evaporation process, physical vapor deposition (PVD) process, chemical vapor deposition (CVD) process, or combination thereof to form electrode materials in the recesses 22, 26, and then pattern the electrode materials through etching process to form the source electrode 28 and the drain electrode 30.

Figure 4:
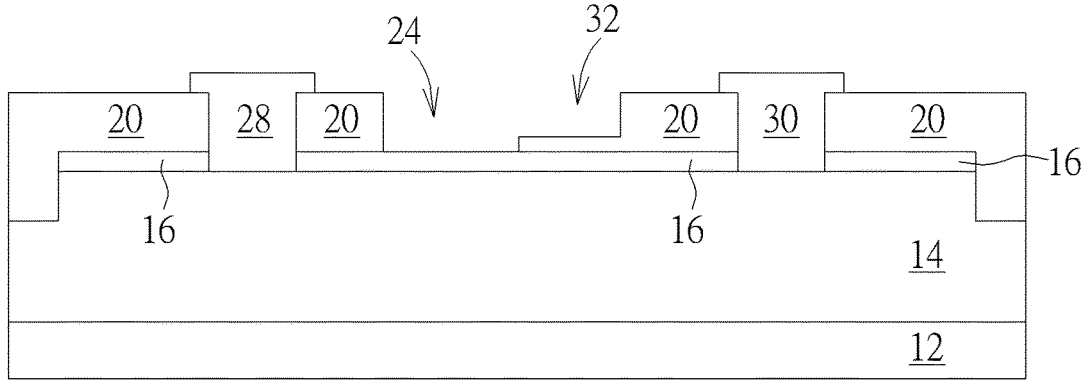

Next, as shown in FIG. 4, another photo-etching process is conducted to remove part of the hard mask 20 adjacent to the recess 24 for forming another recess 32 adjacent to the recess 24, in which the depth of the recess 32 is preferably less than the depth of the recess 24 formed previously. Specifically, in contrast to the bottom of the recess 24 exposes the barrier layer 16, the bottom of the recess 32 exposes the hard mask 20 remained after the etching process, the bottom surface of the recess 24 is lower than the bottom surface of the recess 32, and the recess 24 contacts the recess 32 directly.

Figure 5:
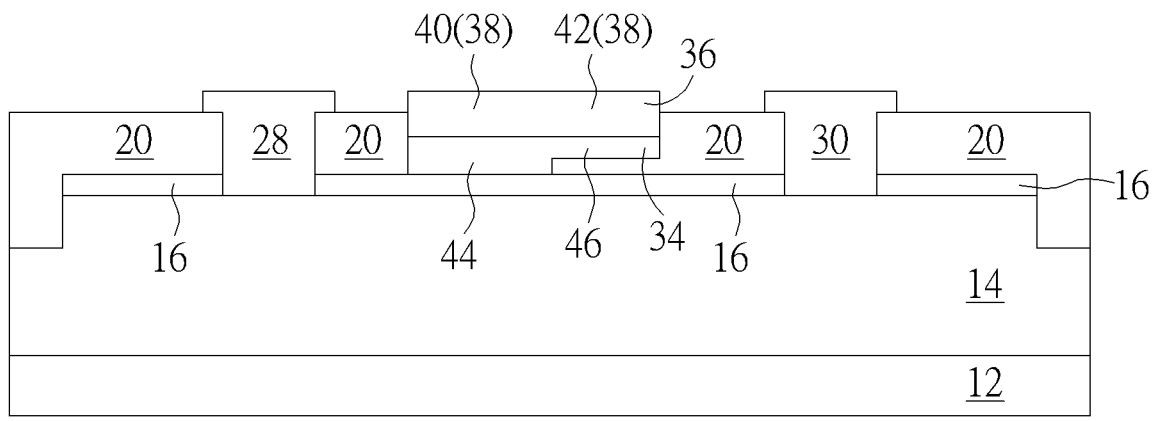

Next, as shown in FIG. 5, a p-type semiconductor layer 34 and a gate material layer 36 are sequentially formed into the recesses 24, 32 and covered on the surfaces of the barrier layer 16 and the hard mask 20, and a photo-etching process is conducted to remove part of the gate material layer 36 to form a gate structure 38 on the barrier layer 16 and the hard mask 20, in which the gate structure 38 after the photo-etching process preferably includes a gate electrode 40 and a field plate 42 disposed adjacent to one side of the gate electrode 40. Specifically, the gate material layer 36 formed into the recess 24 preferably serves as the gate electrode 40 while the gate material layer 36 formed into the recess 32 or directly on top of the hard mask 20 serves as the field plate 42.

Preferably, the gate electrode 40 serves as a switch for turning on and turning off the channel region and the field plate 42 serves to direct the electrical field upward while balancing and diffusing the large current being directed so that the sustainable voltage of the device could increase substantially. In this embodiment, the p-type semiconductor layer 34 preferably is a III-V compound layer including p-type GaN (p-GaN) and the gate material layer 36 preferably includes Schottky metal including but not limited to for example gold, silver, and/or platinum. This completes the fabrication of a HEMT according to an embodiment of the present invention.

Referring again to FIG. 5, FIG. 5 further illustrates a structural view of a HEMT according to an embodiment of the present invention. As shown in FIG. 5, the HEMT includes a buffer layer 14 disposed on the substrate 12, a barrier layer 16 disposed on the buffer layer 14, a p-type semiconductor layer 34 disposed on the barrier layer 16, a gate electrode 40 disposed on the p-type semiconductor layer 34, a hard mask 20 disposed on the barrier layer 16 to surround the p-type semiconductor layer 34 and gate electrode 40 as part of the hard mask 20 is directly under part of the p-type semiconductor layer 34, a field plate 42 disposed on the hard mask 20 adjacent to one side of the gate electrode 40, and a source electrode 28 and drain electrode 30 disposed on the buffer layer 14 adjacent to two sides of the gate electrode 40.

In this embodiment, the p-type semiconductor layer 34 preferably includes a first portion 44 disposed on the barrier layer 16 and a second portion 46 disposed on the hard mask 20, in which the first portion 44 is directly connected to the second portion 46 while the two portions 44, 46 constitute a L-shape altogether, the top surface of the first portion 44 is even with the top surface of the second portion 46 and the top surfaces of both portions 44, 46 are lower than the top surface of the hard mask 20, the bottom surface of the first portion 44 is lower than the bottom surface of the second portion 46, the thickness of the second portion 46 is less than the thickness of the first portion 44, and the first portion 44 and the second portion 46 are made of same material.

Figure 6:
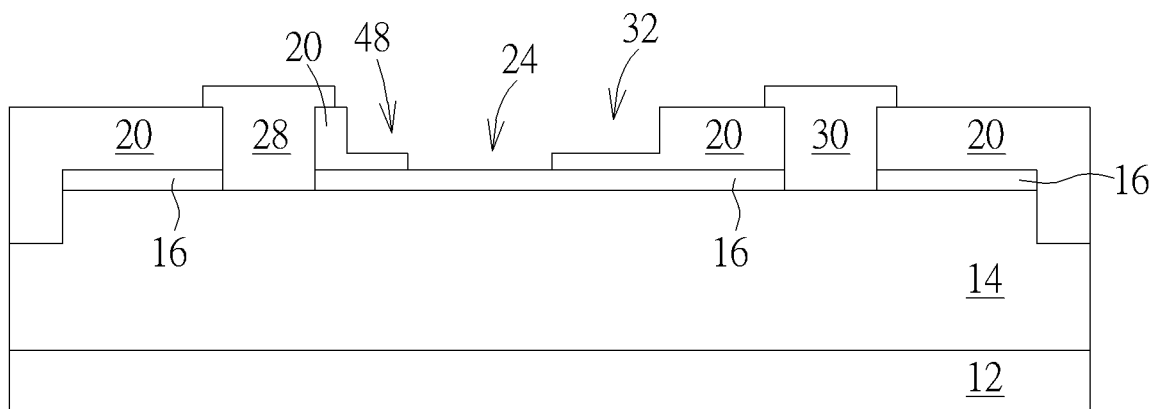
FIGS. 6-7 illustrate a method for fabricating a HEMT according to an embodiment of the present invention.
Figure 7:
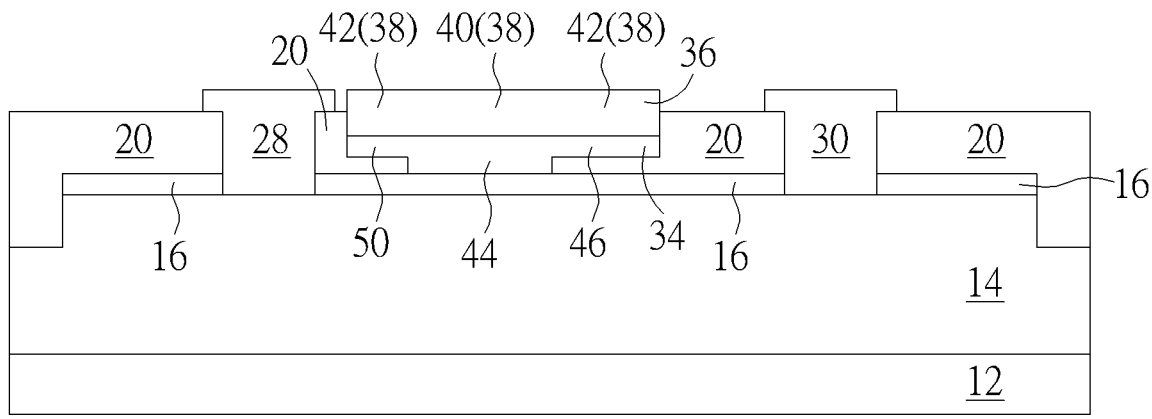

Referring to FIGS. 6-7, FIGS. 6-7 illustrate a method for fabricating a HEMT according to an embodiment of the present invention. As shown in FIG. 6, it would be desirable to first carry out the photo-etching process conducted in FIG. 4 by removing part of the hard mask 20 adjacent to two sides of the recess 24 for forming recess 32 and recess 48, in which the depths of each of the recesses 32, 48 are less than the depth of the recess 24 and the three recesses 24, 32, 48 constitute a T-shaped recess altogether. Specifically, in contrast to the bottom of the recess 24 exposes the barrier layer 16, the bottoms of the recesses 32, 48 both expose the hard mask 20, the bottom surface of the recess 24 is lower than the bottom surfaces of the recesses 32, 48, and the recess 24 is connected to the recesses 32, 48 directly. It should be noted that even though the width of the recess 32 is different from the width of the recess 48, according to other embodiments of the present invention, it would be desirable to adjust the widths of the recesses 32, 48 depending on the demand of the process such that the width of the recess 48 could be less than the width of the recess 32, the width of the recess 48 could be greater than the width of the recess 32, or the width of the recess 48 could be equal to the width of the recess 32, which are all within the scope of the present invention.

Next, as shown in FIG. 7, the process conducted in FIG. 5 could be carried out by sequentially forming a p-type semiconductor layer 34 and a gate material layer 36 into the recesses 24, 32, 48 and onto the surfaces of the barrier layer 16 and hard mask 20, and then conducting a photo-etching process to remove part of the gate material layer 36 to form a gate structure 38 on the barrier layer 16 and hard mask 20, in which the gate structure 38 after the patterning step includes a gate electrode 40 and a field plate 42 adjacent to two sides of the gate electrode 40. This completes the fabrication of a HEMT according to an embodiment of the present invention.

Referring again to FIG. 7, FIG. 7 further illustrates a structural view of a HEMT according to an embodiment of the present invention. As shown in FIG. 7, the HEMT includes a buffer layer 14 disposed on the substrate 12, a barrier layer 16 disposed on the buffer layer 14, a p-type semiconductor layer 34 disposed on the barrier layer 16, a gate electrode 40 disposed on the p-type semiconductor layer 34, a hard mask 20 disposed on the barrier layer 16 to surround the p-type semiconductor layer 34 and gate electrode 40 as part of the hard mask 20 is also under part of the p-type semiconductor layer 34, a field plate 42 disposed on the hard mask 20 adjacent to two sides of the gate electrode 40, and a source electrode 28 and drain electrode 30 disposed on the buffer layer 14 adjacent to two sides of the gate electrode 40.

In this embodiment, the p-type semiconductor layer 34 preferably includes a first portion 44 disposed on the barrier layer 16, a second portion 46 disposed on the hard mask 20 adjacent to one side of the first portion 44, and a third portion 50 disposed on the hard mask 20 adjacent to another side of the first portion 44, in which the first portion 44 is directly connected or directly contacting the second portion 46 and the third portion 50 as the three portions 44, 46, 50 constitute a T-shape altogether. Preferably, the top surface of the first portion 44 is even with the top surfaces of the second portion 46 and third portion 50 while the top surfaces of all three portions 44, 46, 50 are lower than the top surface of the hard mask 20, the bottom surface of the first portion 44 is lower than the bottom surfaces of the second portion 46 and third portion 50, the thickness of each of the second portion 46 and third portion 50 is less than the thickness of the first portion 44, and the first portion 44, second portion 46, and third portion 50 are all made of same material.

It should also be noted that even though the width of the second portion 46 is different from the width of the third portion 50 in this embodiment, according to other embodiments of the present invention, it would be desirable to adjust the widths of the second portion 46 and third portion 50 depending on the demand of the process such that the width of the second portion 46 could be less than the width of the third portion 50, the width of the second portion 46 could be greater than the width of the third portion 50, or the width of the second portion 46 could be equal to the width of the third portion 50, which are all within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating high electron mobility transistor (HEMT), comprising:
    forming a buffer layer on a substrate;
    forming a barrier layer on the buffer layer;
    forming a hard mask on the barrier layer;
    removing the hard mask to form a first recess for exposing the barrier layer, wherein a bottom surface of the first recess is even with a bottom surface of the hard mask;
    removing the hard mask adjacent to the first recess to form a second recess; and
    forming a p-type semiconductor layer in the first recess and the second recess.

2. The method of claim 1, wherein the first recess is directly connected to the second recess.

3. The method of claim 1, wherein a bottom surface of the first recess is lower than a bottom surface of the second recess.

4. The method of claim 1, wherein the p-type semiconductor layer comprises a L-shape.

5. The method of claim 1, further comprising:
    forming a source electrode and a drain electrode adjacent to two sides of the first recess;
    forming the p-type semiconductor layer; and
    forming a gate electrode on the p-type semiconductor layer.

6. The method of claim 1, further comprising:
    removing the hard mask to form the second recess and a third recess adjacent to two sides of the first recess; and
    forming the p-type semiconductor layer in the first recess, the second recess, and the third recess.

7. The method of claim 6, wherein the first recess is directly connected to the second recess and the third recess.

8. The method of claim 6, wherein a bottom surface of the first recess is lower than bottom surfaces of the second recess and the third recess.

9. The method of claim 6, wherein the p-type semiconductor layer comprises a T-shape.

10. The method of claim 1, wherein the p-type semiconductor layer comprises p-type gallium nitride (pGaN).

\* \* \* \* \*